United States Patent
Ichikawa et al.

(10) Patent No.: US 11,114,589 B2
(45) Date of Patent: *Sep. 7, 2021

(54) FLUORIDE PHOSPHOR AND LIGHT-EMITTING DEVICE USING SAME

(71) Applicant: Denka Company Limited, Tokyo (JP)

(72) Inventors: Masayoshi Ichikawa, Fukuoka (JP); Ryosuke Kondo, Fukuka (JP); Hideyuki Emoto, Fukuoka (JP)

(73) Assignee: Denka Company Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/622,783

(22) PCT Filed: Jun. 12, 2018

(86) PCT No.: PCT/JP2018/022451
§ 371 (c)(1),
(2) Date: Dec. 13, 2019

(87) PCT Pub. No.: WO2018/230569
PCT Pub. Date: Dec. 20, 2018

(65) Prior Publication Data
US 2020/0135983 A1    Apr. 30, 2020

(30) Foreign Application Priority Data

Jun. 14, 2017 (JP) .............................. JP2017-117160

(51) Int. Cl.
*H01L 33/50* (2010.01)
*H01L 33/26* (2010.01)

(52) U.S. Cl.
CPC ............ *H01L 33/502* (2013.01); *H01L 33/26* (2013.01)

(58) Field of Classification Search
CPC .............................. H01L 33/502; H01L 33/26
See application file for complete search history.

(56) References Cited

U.S. PATENT DOCUMENTS

| 2006/0169998 A1 | 8/2006 | Radkov et al. |
| 2010/0142189 A1 | 6/2010 | Hong et al. |

(Continued)

FOREIGN PATENT DOCUMENTS

| JP | 8339761 A | 12/1996 |
| JP | 2009528429 A | 8/2009 |

(Continued)

OTHER PUBLICATIONS

US 10,947,450 B2, 03/2021, Ichikawa et al. (withdrawn)*

(Continued)

*Primary Examiner* — Suberr L Chi
(74) *Attorney, Agent, or Firm* — Faegre Drinker Biddle & Reath LLP (57) ABSTRACT

Provided is a fluoride phosphor that has a good external quantum efficiency and is suitable for stably producing white LEDs. The fluoride phosphor has a composition represented by a general formula (1) and a repose angle of 30° or more and 60° or less. general formula: $A_2M_{(1-n)}F_6$:$Mn^{4+}_n$ (1), wherein $0<n\leq0.1$, the element A is one or more alkali metal elements including at least K, and the element M is a simple substance of Si, a simple substance of Ge, or a combination of Si and one or more elements selected from the group consisting of Ge, Sn, Ti, Zr, and Hf.

6 Claims, 3 Drawing Sheets

(56) References Cited

U.S. PATENT DOCUMENTS

| | | |
|---|---|---|
| 2011/0305005 A1 | 12/2011 | Tsukatani et al. |
| 2015/0035430 A1 | 2/2015 | Yoshida et al. |
| 2015/0184071 A1* | 7/2015 | Yu .................. C09K 11/7769 |
| | | 313/503 |
| 2016/0244663 A1 | 8/2016 | Murphy et al. |
| 2018/0282620 A1 | 10/2018 | Ichikawa et al. |

FOREIGN PATENT DOCUMENTS

| | | |
|---|---|---|
| JP | 2010209311 A | 9/2010 |
| JP | 2013127076 A | 6/2013 |
| JP | 201544973 A | 3/2015 |
| JP | 2015140425 A | 8/2015 |
| JP | 201653179 A | 4/2016 |
| JP | 6024850 B2 | 10/2016 |
| JP | 6273394 B1 | 1/2018 |
| WO | 2016133606 A1 | 8/2016 |
| WO | 2017057671 A1 | 4/2017 |
| WO | 2017094832 A1 | 6/2017 |

OTHER PUBLICATIONS

H. Beakawi Al-Hashemi et al., A review on the angle of repose of granular materials, Feb. 27, 2018, vol. 330, pp. 397-417.*
International Search Report for PCT/JP2018/022451 dated Jul. 10, 2018, 4 pages.
A.G. Paulusz, "Efficient Mn(IV) Emission in Fluorine Coordination", J. Electrochem. Soc.: Solid-State Science and Technology, dated Jul. 1973, pp. 942-947.
Translation of the International Preliminary Report on Patentability for PCT/JP2018/022451; dated Dec. 26, 2019, 7 pages.

* cited by examiner

FLUORIDE PHOSPHOR AND LIGHT-EMITTING DEVICE USING SAME

TECHNICAL FIELD

The present invention relates to a fluoride phosphor that is excited by blue light and emits red light, and a light emitting device using the same.

BACKGROUND ART

In recent years, white light emitting diodes (white LEDs), which are a combination of a light emitting diode (LED) and a phosphor, have been applied as white light sources to backlight light sources and lighting devices of displays. Among them, white LEDs using InGaN blue LEDs as excitation sources are widely used.

The phosphor used for the white LED needs to be excited efficiently by the light emission of the blue LED and to emit visible light fluorescence. A typical example of the phosphor for white LED includes a Ce-activated yttrium aluminum garnet (YAG) phosphor that is efficiently excited by blue light and exhibits broad yellow light emission. A pseudo white color is obtained by combining a YAG phosphor singly with a blue LED and exhibits light emission in a wide visible light region. For this reason, the white LED including a YAG phosphor is used for lighting and backlight sources, but few red components cause problems that color rendering is low for lighting applications and color reproduction range is narrow for backlight applications.

For the purpose of improving color rendering and color reproducibility, a white LED combining a red phosphor capable of being excited by a blue LED and a green phosphor such as Eu-activated β-sialon or orthosilicate has also been developed.

As a red phosphor for such a white LED, a nitride or an oxynitride phosphor with $Eu^{2+}$ as the emission center is widely used because of high fluorescence conversion efficiency, small brightness loss at high temperature, and excellent chemical stability, and typical examples thereof include phosphors represented by the chemical formulas, $Sr_2Si_5N_8$:$Eu^{2+}$, $CaAlSiN_3$:$Eu^{2+}$, and $(Ca, Sr) AlSiN_3$:$Eu^{2+}$. However, the emission spectrum of the phosphor using $Eu^{2+}$ is broad and includes many light emitting components with low visibility, and hence the brightness of the white LED is significantly reduced as compared with the case of singly using the YAG phosphor regardless of high fluorescence conversion efficiency. In addition, the phosphor particularly used for displays requires the compatibility of the combination of color filters, causing the following problem: the phosphor having broad emission spectrum (not being sharp) is not preferable.

Examples of the emission center of the red phosphor having a sharp emission spectrum include $Eu^{3+}$ and $Mn^{4+}$. Among them, the red phosphor obtained by activating with dissolving $Mn^{4+}$ in a fluoride crystal such as $K_2SiF_6$ is efficiently excited by blue light and has a sharp emission spectrum with a narrow half-value width. Thus, excellent color rendering and color reproducibility may be realized without lowering the brightness of the white LED, and in recent years, application of the $K_2SiF_6$:$Mn^{4+}$ phosphor to the white LED has been actively investigated (refer to Non Patent Literature 1).

Patent Literature 1 discloses a fluoride phosphor having a predetermined composition including silicon and having a weight median diameter of 35 μm or more and a bulk density of 0.80 g/cm³ or more.

CITATION LIST

Patent Literature

Patent Literature 1: Japanese Patent No. 6024850

Non Patent Literature

Non Patent Literature 1: A. G. Paulusz, Journal of The Electrochemical Society, 1973, Volume 120, issue 7, p. 942-947

SUMMARY OF INVENTION

Technical Problem

In light emitting devices such as backlights of liquid crystal displays and lighting fixtures, improvement of light emission characteristics is always required, and hence, improvement of characteristics of each member is required, and phosphors are also required to improve light emission characteristics. The white LED using a $K_2SiF_6$:$Mn^{4+}$ phosphor has the following problem: the light emission characteristics vary significantly.

The present inventors have found that even the fluoride phosphor disclosed in the above Patent Literature 1 causes the following problem: sufficient brightness actually fails to be obtained stably and the yield as white LED products is bad.

For this reason, there is a demand for the fluoride phosphor that has good external quantum efficiency and is suitable for stably producing white LEDs.

Solution to Problem

As a result of various investigations on the physical properties of the fluoride phosphor, the present inventors have found that using fluoride phosphors having specific powder characteristics may stably produce white LEDs with excellent external quantum efficiency, and have reached the present invention.

That is, the present invention provides the following.

[1]

A fluoride phosphor having a composition represented by the following general formula (1) and a repose angle of 30° or more and 60° or less.

General formula: (1)

wherein 0<n≤0.1; an element A is one or more alkali metal elements containing at least K; an element M is a simple substance of Si, a simple substance of Ge, or a combination of Si and one or more elements selected from the group consisting of Ge, Sn, Ti, Zr, and Hf.

[2]

The fluoride phosphor according to [1], wherein in the general formula (1), the element A is a simple substance of K and the element M is a simple substance of Si.

[3]

The fluoride phosphor according to [1] or [2], wherein the bulk density is 0.80 g/cm³ or more and 1.40 g/cm³ or less.

[4]

A fluoride phosphor according to [1] to [3], wherein a span value is 1.5 or less, as calculated by the following formula (2) using a 10% diameter (D10), a mass median diameter (D50), and a 90% diameter (D90) obtained from a mass-based cumulative distribution curve.

(span value)=(D90−D10)/D50   General formula: (2)

[5]
A light emitting device comprising:
the fluoride phosphors according to [1] to [4] and
a light emitting source.

[6]
The light emitting device according to [5], wherein a peak wavelength of the light emitting source is 420 nm or more and 480 nm or less.

[7]
The light emitting device according to [5] or [6], wherein the light emitting device is a white LED device.

Advantageous Effects of Invention

The present invention may provide a fluoride phosphor suitable for stable production of white LEDs having good light emission characteristics.

DESCRIPTION OF EMBODIMENTS

In the present specification, unless otherwise specified, when a numerical range is indicated, the upper limit value and the lower limit value are included.

The present invention is a fluoride phosphor represented by the general formula: $A_2M_{(1-n)}F_6:Mn^{4+}{}_n$. In the general formula, the element A is an alkali metal element including at least potassium (K), and specifically is a simple substance of potassium or a combination of potassium and at least one or more alkali metal elements selected from lithium (Li), sodium (Na), rubidium (Rb), and cesium (Cs). From the viewpoint of chemical stability, the content of potassium in the element A is preferably higher, and most preferably, a simple substance of potassium may be used as the element A.

In the general formula, the element M is a tetravalent element including at least silicon (Si), and specifically is a simple substance of silicon, a simple substance of germanium (Ge), or a combination of silicon and one or more elements selected from the group consisting of germanium, tin (Sn), titanium (Ti), zirconium (Zr), and hafnium (Hf). From the viewpoint of chemical stability, the content of silicon in the element M is preferably higher, and most preferably, a simple substance of silicon may be used as the element M. In the general formula, F is fluorine and Mn is manganese.

In the fluoride phosphor according to the embodiment of the present invention, the repose angle measured in accordance with JIS R9301-2-2: 1999 is required to be 30° or more and 60° or less. The repose angle indicates the fluidity of the fluoride phosphor, that is, an index representing the degree of dispersion when the fluoride phosphor is used in an LED. When the repose angle is less than 30°, sufficient fluidity of the fluoride phosphor is not obtained, and when the repose angle is more than 60°, the fluidity of the fluoride phosphor is too high, and both cases cause the following unpreferable problem: the variation in the external quantum efficiency of the produced LED is large. In a more preferable embodiment, the repose angle may be in the range of 32° or more and 58° or less, and still more preferably in the range of 34° or more and 56° or less.

In the fluoride phosphor according to the embodiment of the present invention, the bulk density is preferably 0.80 $g/cm^3$ or more. The bulk density is less than 0.80 $g/cm^3$, which may reduce the external quantum efficiency and result in the large variation in the external quantum efficiency of the LED produced by using this phosphor. The bulk density is also preferably 1.40 $g/cm^3$ or less, and the bulk density exceeds 1.40 $g/cm^3$, which may tend to result in large variation in the external quantum efficiency of the LED and thereby inferior performance. In a more preferable embodiment, the bulk density may be in the range of 0.90 $g/cm^3$ or more and 1.40 $g/cm^3$ or less, and still more preferably in the range of 1.00 $g/cm^3$ or more and 1.30 $g/cm^3$ or less.

The bulk density may vary depending on the state of the powder surface and the post-treatment method during manufacturing, and is not immediately determined from the only particle size distribution. That is, the present invention is based on the effect obtained from a novel combination of a predetermined bulk density and mass median diameter.

The fluoride phosphor according to the embodiment of the present invention preferably further has the span value of 1.5 or less. In the present specification, the span value means a value calculated by (D90−D10)/D50, wherein D10, D50, and D90 respectively refer to a 10% diameter, a 50% diameter (mass median diameter), and a 90% diameter obtained from a mass-based cumulative distribution curve converted from a volume-based cumulative distribution curve measured by a laser diffraction scattering method in accordance with JIS R1622:1995 and R1629:1997. In addition, D100 refers to a 100% diameter as described above. The span value is an index representing the distribution width of the particle size distribution, that is, the variation in the size of the fluoride phosphor particles. Too large a span value may result in larger variation in the external quantum efficiency of the produced LED. That is, a span value of 1.5 or less results in sharp distribution of the particle size of the fluoride phosphor, meaning to have the characteristics that the particles are uniform as a powder, and it is assumed that the effect of further improving dispersibility in the encapsulation resin may be exhibited. In a preferable embodiment, the span value may be in the range of 0.1 or more and 1.4 or less, in the range of 0.1 or more and 1.3 or less, in the range of 0.1 or more and 1.2 or less, or in the range of 0.1 or more and 1.1 or less.

In a preferable embodiment, the above mass median diameter (D50) may be 30 μm or less. When D50 exceeds 30 μm, the dispersibility in an encapsulation resin in manufacturing a white LED is deteriorated, the brightness is lowered, and the manufacturing stability may be lowered. In addition, D50 is preferably 15 μm or more, and when D50 is less than 15 μm, the external quantum efficiency may be lowered. In a more preferable embodiment, D50 may be in the range of 15 μm or more and 30 μm or less, more preferably in the range of 16 μm or more and 29 μm or less.

In the fluoride phosphor according to the embodiment of the present invention, furthermore, the mass-based frequency distribution curve is preferably unimodal. The single peak (mode diameter) is more preferably 10 μm or more, and furthermore preferably 10 μm or more and 100 μm.

In a preferable embodiment, the fluoride phosphor may have a combination of a repose angle of 30° or more and 60° or less, a bulk density of 0.80 g/cm$^3$ or more, and a span value of 1.5 or less. In a more preferable embodiment, the fluoride phosphor may also have a combination of a repose angle of 34° or more and 56° or less, a bulk density of 0.80 g/cm$^3$ or more and 1.40 g/cm$^3$ or less, and a span value of 0.1 or more and 1.4 or less.

The fluoride phosphor according to the embodiment of the present invention may be prepared by, for example, a method including the following steps so as to have predetermined powder characteristics (such as bulk density and mass median diameter). A step of mixing hydrofluoric acid and a compound of an alkali metal hydrofluoride to obtain a solution. A step of adding a tetravalent element oxide and a compound of an alkali metal hexafluoromanganate to the solution to obtain a precipitate. A step of collecting, washing, and drying the precipitate to obtain a fluoride phosphor (powder).

Adjustment of powder characteristics may be controlled by the blending ratio of the hydrofluoric acid, the compound of the alkali metal hydrofluoride, the oxide of the tetravalent element, and the compound of the alkali metal hexafluoromanganate described above, or the addition rate of the oxide of the tetravalent element and the compound of the alkali metal hexafluoromanganate. Generally, in the field of phosphors, it is known that the physical properties (such as a form as a substance and peak wavelength and spectrum shape of emission spectrum) are different depending on the different main components of the phosphor. That is, it should be noted that the fluoride phosphor according to the embodiment of the present invention naturally exhibits completely different behavior when used in a light emitting device even if the powder characteristics are apparently the same as other phosphors such as a YAG phosphor and a sialon phosphor.

The obtained fluoride phosphor powder may be further classified by using means such as a sieve or a classifier and adjusted so as to obtain desired powder characteristics. In addition, the above step group is preferably performed at normal temperature. In the present specification, "normal temperature" refers to a temperature range defined by JIS Z8703: 1983, that is, a temperature in a range of 20±15° C.

In the embodiment of the present invention, a light emitting device (such as an LED) including the above fluoride phosphor and a light emitting source may be also provided. In such a light emitting device, the fluoride phosphor is preferably used by encapsulating it in a encapsulant. Such an encapsulant is not particularly limited, and examples thereof include silicone resin, epoxy resin, perfluoropolymer resin, and glass. In applications requiring high output and high brightness, such as display backlight applications, an encapsulant having durability against exposure to even high temperatures or intense light is preferable, and from the viewpoint of this, a silicone resin is particularly preferable.

The light emitting source is preferable to emit light having a wavelength that complements the red light emission of the fluoride phosphor or light having a wavelength that may efficiently excite the fluoride phosphor, and for example, a blue light source (such as blue LED) may be used. Preferably, the peak wavelength of light from the light emitting source may be a wavelength in a range including blue (for example, a range of 420 nm or more and 560 nm or less), and more preferably a range of 420 nm or more and 480 nm or less.

EXAMPLES

Hereinafter, the present invention is described in more detail with reference to Examples and Comparative Examples of the present invention.

<Manufacturing Step of $K_2MnF_6$>

$K_2MnF_6$ used for performing the manufacturing methods of the fluoride phosphors in Examples and Comparative Examples was prepared according to the method described in Non Patent Literature 1. Specifically, 800 ml of 40% hydrofluoric acid by mass was placed in a fluororesin beaker having a capacity of 2000 ml, and 260.00 g of potassium hydrogen fluoride powder (manufactured by Wako Pure Chemical Industries, Ltd., guaranteed reagent) and 12.00 g of potassium permanganate powder (manufactured by Wako Pure Chemical Industries, Ltd., the first grade reagent) were dissolved. While stirring this hydrofluoric acid solution with a magnetic stirrer, 8 ml of a 30% hydrogen peroxide solution (guaranteed reagent) was dropped in portions. When the dropping amount of the hydrogen peroxide solution exceeded a certain amount, a yellow powder started to deposit and the color of the reaction solution started to change from purple. A certain amount of the hydrogen peroxide solution was dropped, and then stirring was continued for a while, and then stirring was stopped to precipitate a deposited powder. After the precipitation, the supernatant was removed, methanol was added, stirred, left, the supernatant was removed, and methanol was further added, and this operation was repeated until the solution became neutral. Thereafter, the deposited powder was collected by filtration, further dried, and methanol was completely removed by evaporation to obtain 19.00 g of $K_2MnF_6$ powder. All these operations were performed at normal temperature.

Example 1

As Example 1, a method of manufacturing a fluoride phosphor represented by $K_2SiF_6$:Mn is shown below. Under normal temperature, 200 ml of 55% hydrofluoric acid by mass was placed in 500 ml of a fluororesin beaker, and 25.6 g of $KHF_2$ powder (manufactured by Wako Pure Chemical Industries, Ltd., guaranteed reagent) was dissolved to prepare an aqueous solution (B). To this solution, 6.9 g of silica ($SiO_2$, trade name FB-50R, manufactured by Denka Company Limited) and 1.1 g of $K_2MnF_6$ powder were added. When silica powder was added to the aqueous solution, the temperature of the aqueous solution increased due to the generation of heat of dissolution. The solution temperature reached the maximum temperature about 3 minutes after the addition of silica, and then the solution temperature decreased because dissolution of the silica was completed. It was visually confirmed that yellow powder started to form in the aqueous solution immediately after silica powder was added.

The silica powder was completely dissolved, and then the aqueous solution was stirred for a while to complete the deposition of the yellow powder, and then the aqueous solution was left to stand to precipitate a solid substance. After confirming the precipitation, the supernatant was removed, and the yellow powder was washed with hydrofluoric acid having a concentration of 20% by mass and methanol, and this was further filtered to separate and collect the solid substance, and the remaining methanol was removed by evaporation through a drying treatment. After the drying treatment, a nylon sieve having an opening of 75 μm was used, and only the yellow powder that passed through this sieve was classified and collected to finally obtain 19.9 g of yellow powder.

<Confirmation of Yellow Powder Mother Crystal by Crystal Phase Measurement>

Figure 1:
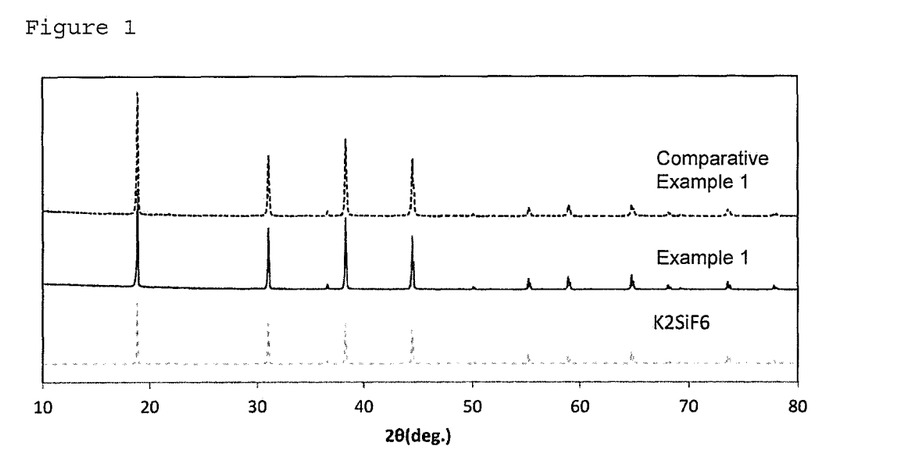
FIG. 1 shows comparison of the X-ray diffraction pattern of the phosphor obtained in Example 1 with that of $K_2SiF_6$ (ICSD-29407) which is Comparative Example 1 and a control. The vertical axis in the figure represents the number of the count of the signal.

For the yellow powder obtained in Example 1, the X-ray diffraction pattern was measured by using an X-ray diffractometer (trade name Ultima4, manufactured by Rigaku Corporation, CuKα tube bulb was used). The obtained X-ray diffraction pattern is shown in FIG. 1. As a result, the X-ray diffraction pattern of the sample obtained in Example 1 was the same pattern as that of the $K_2SiF_6$ crystal, confirming that $K_2SiF_6$:Mn was obtained in a single phase.

Example 2 and Comparative Examples 1 to 4

Example 2 and Comparative Examples 1 to 4 were obtained in the same manner as in Example 1, except that the blending composition in Example 1 was changed to the formulation shown in Table 1 below. X-ray diffraction patterns were measured for the obtained yellow powders, all of which showing the same pattern as the $K_2SiF_6$ crystal.

TABLE 1

|  | Hydrofluoric acid (ml) | KHF2 (g) | SiO2 (g) | K2MnF6 (g) |
| --- | --- | --- | --- | --- |
| Example 1 | 200 | 25.6 | 6.9 | 1.1 |
| Example 2 | 200 | 35.1 | 6.9 | 1.1 |
| Comparative Example 1 | 200 | 25.5 | 13.3 | 1.1 |
| Comparative Example 2 | 200 | 20.5 | 6.9 | 1.1 |
| Comparative Example 3 | 200 | 25.5 | 9.8 | 1.1 |
| Comparative Example 4 | 200 | 23.5 | 6.9 | 1.1 |

<Evaluation of Light Emission Characteristics of Fluoride Phosphor>

Figure 2:
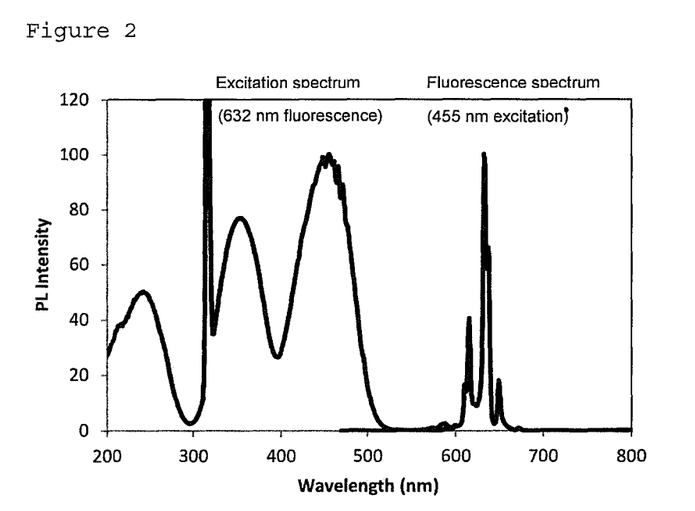
FIG. 2 shows excitation and fluorescence spectra of the phosphor obtained in Example 1.

The light emission characteristics of the fluoride phosphors in Examples 1 to 2 and Comparative Examples 1 to 4 were evaluated by measuring the absorption rate, internal quantum efficiency, and external quantum efficiency by the following methods. That is, a standard reflector plate (trade name Spectralon, manufactured by Labsphere, Inc.) having a reflectance of 99% was set in the side opening (φ10 mm) of the integrating sphere (φ60 mm). Monochromatic light separated at a wavelength of 455 nm from a light emitting source (Xe lamp) was introduced into this integrating sphere with an optical fiber, and the spectrum of reflected light was measured with a spectrophotometer (trade name MCPD-7000, manufactured by Otsuka Electronics Co., Ltd.). At the time, the excitation light photon number (Qex) was calculated from the spectrum in the wavelength range of 450 to 465 nm. Next, a concave cell filled with a phosphor so as to obtain a smooth surface was set in the opening of the integrating sphere and irradiated with monochromatic light with a wavelength of 455 nm, and the excitation reflected light and fluorescence spectra were measured with the spectrophotometer. An excitation and fluorescence spectrums obtained from the fluoride phosphor in Example 1 are shown in FIG. 2 as a representative. The photon number of excitation and reflection light (Qref) and the fluorescence photon number (Qem) were calculated from the obtained spectrum data. The photon number of excitation and reflection light was calculated in the same wavelength range as the excitation light photon number, and the fluorescent photon number was calculated in the range of 465 to 800 nm. From the obtained three types of photon numbers, external quantum efficiency (=Qem/Qex×100), absorption rate (=(Qex−Qref)/Qex×100), and internal quantum efficiency (=Qem/(Qex−Qref)×100) were determined.

<Evaluation of Repose Angle of Fluoride Phosphor>

The repose angle of each fluoride phosphor in Examples 1 and 2 and Comparative Examples 1 to 4 was evaluated by an injection method in accordance with JIS R 9301-2-2: 1999. That is, from the height of 2 to 4 cm of the upper edge of a commercially available glass funnel having a nozzle inner diameter of 6 mm, 200 g of the powder to be measured was dropped onto the substrate through the funnel at a rate of 20 to 60 g per minute, and from the diameter and height of the generated conical deposit, the repose angle was calculated.

<Bulk Density of Fluoride Phosphor>

The bulk density of each of the fluoride phosphors in Examples 1 to 2 and Comparative Examples 1 to 4 was evaluated in accordance with JIS R 1628: 1997. That is, a constant volume container (100 cc) was used as a measurement container, and its mass was measured with a scale. The sample was placed in the measurement container through a sieve until it overflowed, while taking sufficient care not to apply vibration or pressure. The powder rising from the upper end surface of the measurement container was leveled off using a leveling plate. At the time, the leveling plate was used by being inclined backward from the direction of grinding so as not to compress the powder. The mass of the measurement container was weighed with a scale, and the mass of the sample was calculated by subtracting the mass of the measurement container. This measurement was performed three times. The average value of the values obtained by dividing the mass of the sample calculated in each measurement by the volume of the measurement container was calculated as the bulk density.

<Evaluation of Span Value of Fluoride Phosphor>

The span value of each fluoride phosphor in Examples 1 and 2 and Comparative Examples 1 to 4 was evaluated by the following methods. That is, 30 ml of ethanol was weighed in a 50 ml beaker, and 0.03 g of a phosphor was placed therein. Nest, this container was set in a homogenizer (trade name US-150E, manufactured by Nippon Seiki Seisakusho Co., Ltd.) whose output was adjusted to "Altitude: 100%" in advance, and pretreatment was performed for 3 minutes. For the solution prepared as described above, D10, D50 (mass median diameter), D90, and D100 were determined by using a laser diffraction/scattering particle size distribution analyzer (trade name MT3300EXII, manufactured by MicrotrackBell Corporation). Using the obtained D10, D50, and D90, the span value was calculated as (D90−D10)/D50.

Figure 3:
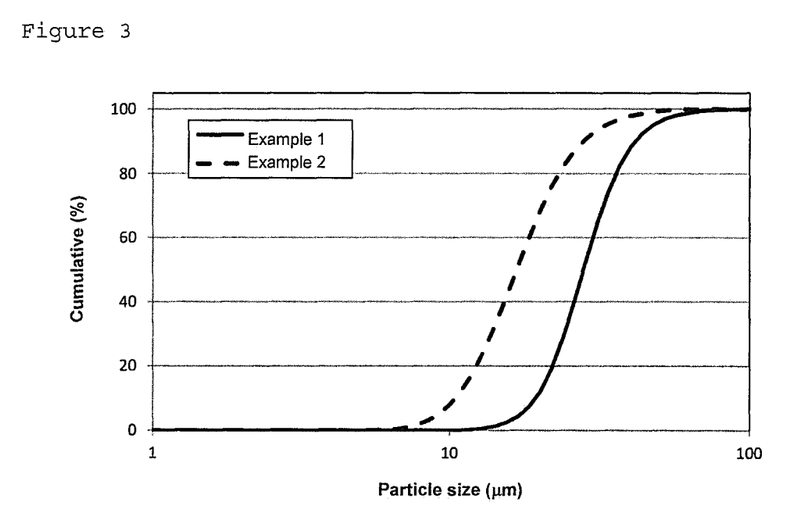
FIG. 3 is a cumulative distribution curve of the phosphor according to Examples 1 to 2.
Figure 4:
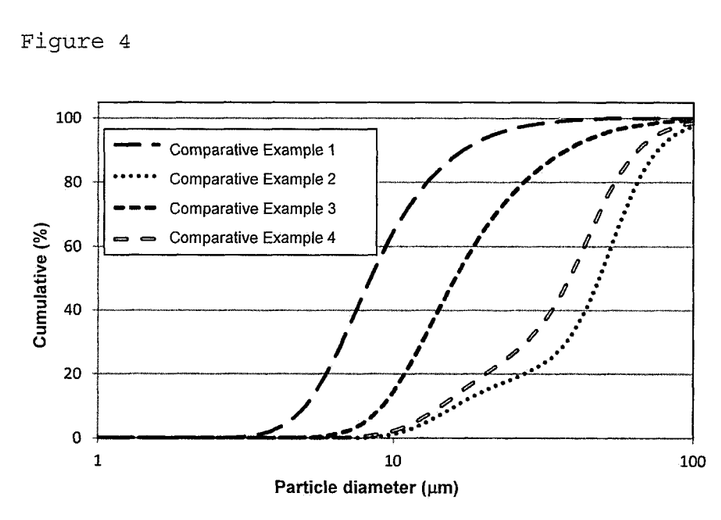
FIG. 4 is a cumulative distribution curve of the phosphor according to Comparative Examples 1 to 4.
Figure 5:
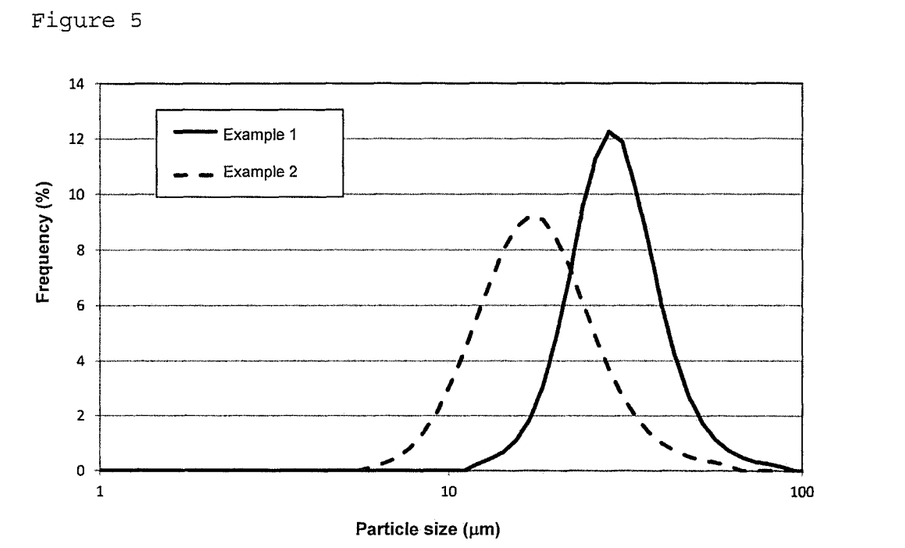
FIG. 5 is a frequency distribution curve of the phosphor according to Examples 1 to 2.
Figure 6:
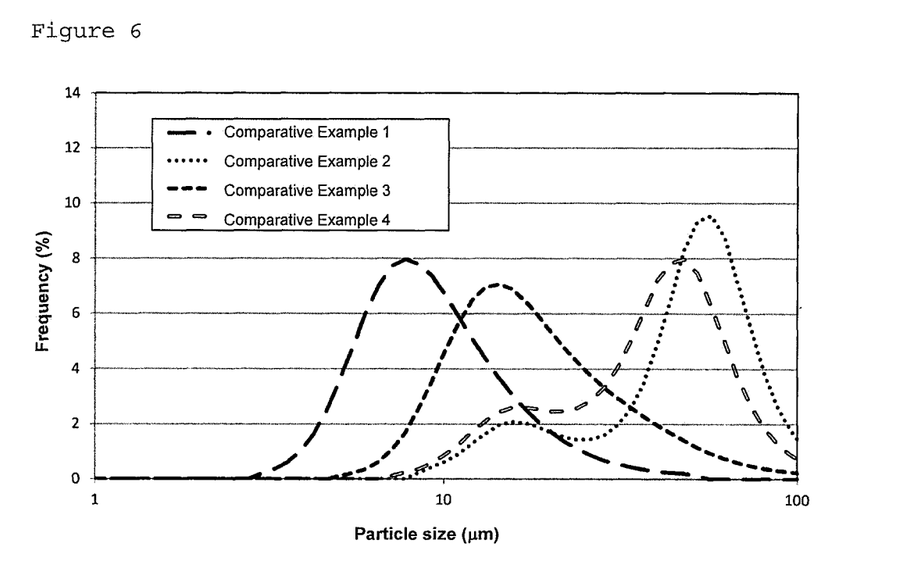
FIG. 6 is a frequency distribution curve of the phosphor according to Comparative Examples 1 to 4.

The evaluation result of each fluoride phosphor in Examples 1 to 2 and Comparative Examples 1 to 4 is summarized in Table 2 below. In addition, FIG. 3 and FIG. 5 show the cumulative distribution curve and the frequency distribution curve of Examples 1 and 2, respectively. Further, FIG. 4 and FIG. 6 show the cumulative distribution curve and frequency distribution curve of Comparative Examples 1 to 4, respectively.

TABLE 2

Optical characteristics (455 nm excitation, unit: %)

| | Absorbance ratio | Internal quantum efficiency | External quantum efficiency | Bulk density (g/cm$^3$) | Particle size distribution (μm) | | | | Span value | Repose angle |
|---|---|---|---|---|---|---|---|---|---|---|
| | | | | | D10 | D50 | D90 | D100 | | |
| Example 1 | 81 | 81 | 66 | 1.25 | 19.5 | 28.1 | 41.7 | 87.5 | 0.79 | 39° |
| Example 2 | 70 | 80 | 56 | 1.03 | 10.5 | 16.8 | 28.1 | 61.9 | 1.05 | 56° |
| Comparative Example 1 | 52 | 75 | 39 | 0.55 | 5.1 | 8.4 | 17.0 | 52.0 | 1.42 | 61° |
| Comparative Example 2 | 83 | 75 | 62 | 1.42 | 16.1 | 48.7 | 75.9 | 147.4 | 1.23 | 23° |
| Comparative Example 3 | 70 | 78 | 55 | 0.73 | 9.2 | 16.0 | 37.7 | 123.7 | 1.78 | 61° |
| Comparative Example 4 | 83 | 76 | 63 | 1.36 | 14.4 | 38.8 | 65.1 | 147.1 | 1.31 | 27° |

<Evaluation of Light Emission Characteristics of LED Using Fluoride Phosphor>

The fluoride phosphor in Example 1 was added to a silicone resin together with β-sialon green phosphor (trade name GR-MW540K, manufactured by Denka Company Limited). After defoaming and kneading, potting was performed in a surface-mount package to which a blue LED element with a peak wavelength of 455 nm was bonded, and furthermore it was thermally cured to produce the white LED in Example 3. The addition ratio of the fluoride phosphor and the β-sialon green phosphor was adjusted so that the chromaticity coordinates (x, y) of the white LED became (0.28, 0.27) in light emission during energization.

Example 4 was produced in the same manner as in Example 3, except that the phosphor in Example 2 was used instead of the phosphor in Example 1. Each white LED in Comparative Examples 5 to 8 was also produced in the same manner as in Example 3, except that each phosphor in Comparative Examples 1 to 4 was used. The addition ratio of the fluoride phosphor and the β-sialon green phosphor was all adjusted so that the chromaticity coordinates (x, y) of the white LED became (0.28, 0.27) in light emission during energization.

<Evaluation of Variation in Light Emission Characteristics>

In Examples 3 and 4 and Comparative Examples 5 to 8, a white LED was produced 10 times in the same manner, and the light emission characteristics (external quantum efficiency) of the sample obtained every 10 productions were measured to compare and evaluate variations in external quantum efficiency due to differences in fluoride phosphors. Table 3 below shows the luminance, the average value, and the standard deviation of each white LED when the luminance of the white LED produced for the first time in Example 3 is defined as 100. It was found that Example 3 had higher external quantum efficiency and smaller standard deviation at the time of 10 measurements as compared with Comparative Example 5 and hence had little variation in quality and excellent and stable yield. In Example 4, the same excellent results as in Example 3 were obtained. In all of Comparative Examples 5 to 8, the external quantum efficiency was low and the variation was large.

TABLE 3

External quantum efficiency (455 nm excitation, unit: %)

| | 1st | 2nd | 3rd | 4th | 5th |
|---|---|---|---|---|---|
| Example 3 | 98 | 101 | 101 | 102 | 101 |
| Example 4 | 98 | 102 | 100 | 97 | 100 |
| Comparative Example 5 | 86 | 92 | 87 | 93 | 94 |
| Comparative Example 6 | 97 | 93 | 98 | 88 | 96 |
| Comparative Example 7 | 95 | 94 | 93 | 86 | 97 |
| Comparative Example 8 | 95 | 91 | 95 | 95 | 98 |

| | 6th | 7th | 8th | 9th | 10th | Average value | Standard deviation |
|---|---|---|---|---|---|---|---|
| Example 3 | 101 | 99 | 98 | 102 | 100 | 100 | 1.5 |
| Example 4 | 98 | 98 | 101 | 102 | 98 | 99 | 1.8 |
| Comparative Example 5 | 86 | 93 | 87 | 84 | 86 | 89 | 3.7 |
| Comparative Example 6 | 86 | 87 | 95 | 94 | 92 | 93 | 4.3 |
| Comparative Example 7 | 96 | 86 | 94 | 86 | 85 | 91 | 4.8 |
| Comparative Example 8 | 91 | 99 | 86 | 93 | 89 | 93 | 4.0 |

It is understood from the results of Examples and Comparative Examples shown in Tables 2 to 3 that the fluoride phosphor represented by $A_2M_{(1-n)}F_6:Mn^{4+}{}_n$ of the present invention has an effect of stably obtaining a high external quantum efficiency when used as an LED due to the repose angle being in a specific range. It is also understood that the repose angle is not in a specific range, exhibiting no effect.

INDUSTRIAL APPLICABILITY

Using the fluoride phosphor represented by $A_2M_{(1-n)}F_6:Mn^{4+}{}_n$ of the present invention for an LED may stably provide an LED having good light emission characteristics. The fluoride phosphor according to the present invention may be suitably used as a phosphor for white LED using blue light as a light source, and may be suitably used for light emitting devices such as lighting fixtures and image display devices.

The invention claimed is:

1. A fluoride phosphor having a composition represented by a following general formula (1) and a repose angle of 30° or more and 60° or less:

$$A_2M_{(1-n)}F_6:Mn^{4+}_n \quad \text{formula (1)}$$

wherein $0<n\leq 0.1$; an element A is one or more alkali metal elements containing at least K; and an element M is a simple substance of Si, a simple substance of Ge, or a combination of Si and one or more elements selected from the group consisting of Ge, Sn, Ti, Zr, and Hf;

wherein a bulk density of the fluoride phosphor is 1.00 g/cm³ or more and 1.40 g/cm³ or less, and wherein a mass median diameter (D50) of the fluoride phosphor is 29 μm or less.

2. The fluoride phosphor according to claim 1, wherein in the general formula (1), the element A is a simple substance of K and the element M is a simple substance of Si.

3. The fluoride phosphor according to claim 1, wherein a span value is 1.5 or less, as calculated by the following formula (2) using a 10% diameter (D10), a mass median diameter (D50), and a 90% diameter (D90) obtained from a mass-based cumulative distribution curve:

$$\text{(span value)}=(D90-D10)/D50 \quad \text{formula (2)}$$

4. A light emitting device comprising:
   the fluoride phosphor according to claim 1; and
   a light emitting source.

5. The light emitting device according to claim 4, wherein a peak wavelength of the light emitting source is 420 nm or more and 480 nm or less.

6. The light emitting device according to claim 4, wherein the light emitting device is a white LED device.

* * * * *